United States Patent
Stoller

[19]
[11] Patent Number: 6,164,369
[45] Date of Patent: Dec. 26, 2000

[54] DOOR MOUNTED HEAT EXCHANGER FOR OUTDOOR EQUIPMENT ENCLOSURE

[75] Inventor: Harry R. Stoller, Basking Ridge, N.J.

[73] Assignee: Lucent Technologies Inc., Murray Hill, N.J.

[21] Appl. No.: 09/353,469

[22] Filed: Jul. 13, 1999

[51] Int. Cl.[7] ................................................. F28D 15/00
[52] U.S. Cl. .............................. 165/104.33; 165/104.34; 361/724; 361/696; 454/184
[58] Field of Search ................................ 165/122, 104.34, 165/104.33, 80.3; 361/384, 385, 687, 688, 689, 704, 707; 174/16.1, 16.3; 454/184

[56] References Cited

U.S. PATENT DOCUMENTS

| | | | |
|---|---|---|---|
| 4,306,613 | 12/1981 | Christopher | 165/104.33 |
| 4,386,651 | 6/1983 | Reinhard | 165/104.33 |
| 4,449,579 | 5/1984 | Miyazaki et al. | 165/104.34 |
| 5,035,281 | 7/1991 | Neuenfeldt et al. | 165/104.34 |
| 5,090,476 | 2/1992 | Immel | 165/122 |
| 5,361,188 | 11/1994 | Kondou et al. | 165/104.34 |
| 5,738,166 | 4/1998 | Chou | 165/104.21 |
| 6,000,464 | 12/1999 | Scafidi et al. | 165/104.33 |
| 6,041,851 | 3/2000 | Diebel et al. | 165/104.33 |
| 6,067,223 | 7/2000 | Diebel et al. | 165/104.33 |
| 6,088,255 | 7/2000 | Parry et al. | 361/704 |

FOREIGN PATENT DOCUMENTS

| | | | |
|---|---|---|---|
| 2277767 | 11/1984 | United Kingdom | 165/104.34 |

*Primary Examiner*—Ira S. Lazarus
*Assistant Examiner*—Terrell McKinnon
*Attorney, Agent, or Firm*—Needle & Rosenberg, P.C.; Charles H. Fails, Esq.

[57] ABSTRACT

A modular door mounted heat exchanger (10) for use with an outdoor equipment enclosure (12) of the type having a sealed equipment compartment (22) used to house heat generating electronics and telecommunications equipment (29) therein is disclosed. The heat exchanger includes a door panel (33) sized and shaped to be received on, and to close an access opening (20) defined as a part of the equipment enclosure. The door panel has an interior surface (34) for facing inwardly of the enclosure, and an exterior surface (36) for facing outwardly of the enclosure. A heat exchanger cover (37) constructed and arranged to be mounted to the exterior surface of the door panel is provided. The heat exchanger cover defines a plenum (38) between the exterior surface of the door panel and the heat exchanger cover. At least a first opening (40) and at least a spaced second opening (41) are defined within the plenum for defining an air flow path (44, 45) passing within and at least partially along the plenum. At least one fan (42, 48, 79) is provided for drawing air into and exhausting air out of the plenum through the at least first and second openings, respectively. The fan is constructed and arranged to draw outside air through the plenum for cooling the exterior surface of the door panel, so that the air within the enclosure that comes into contact with the interior surface of the door panel is in turn cooled.

24 Claims, 5 Drawing Sheets

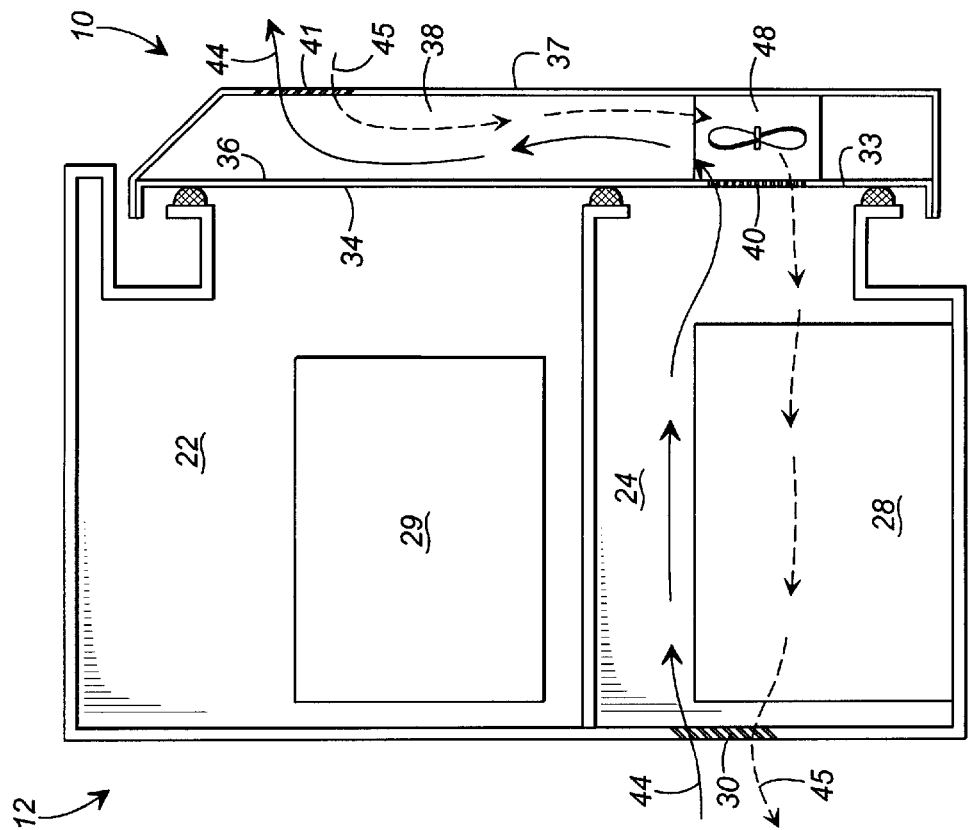
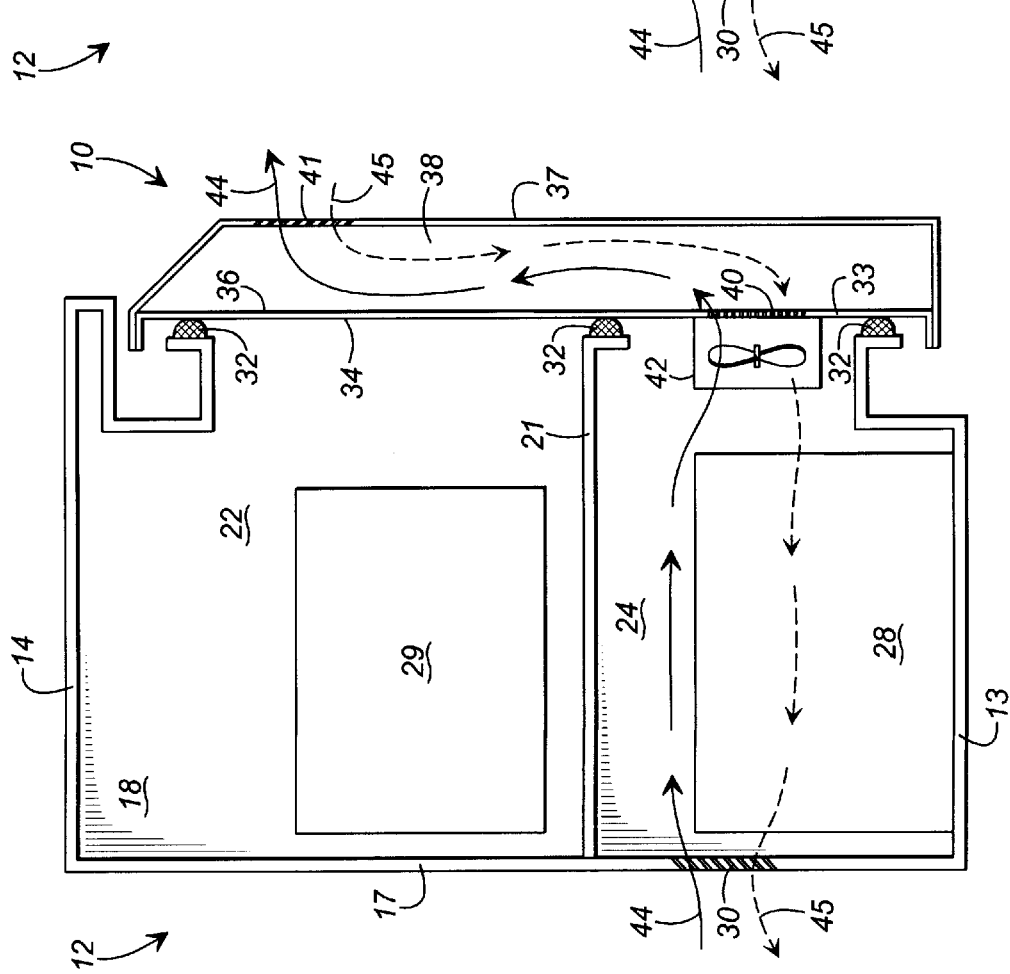
FIG. 2
FIG. 3

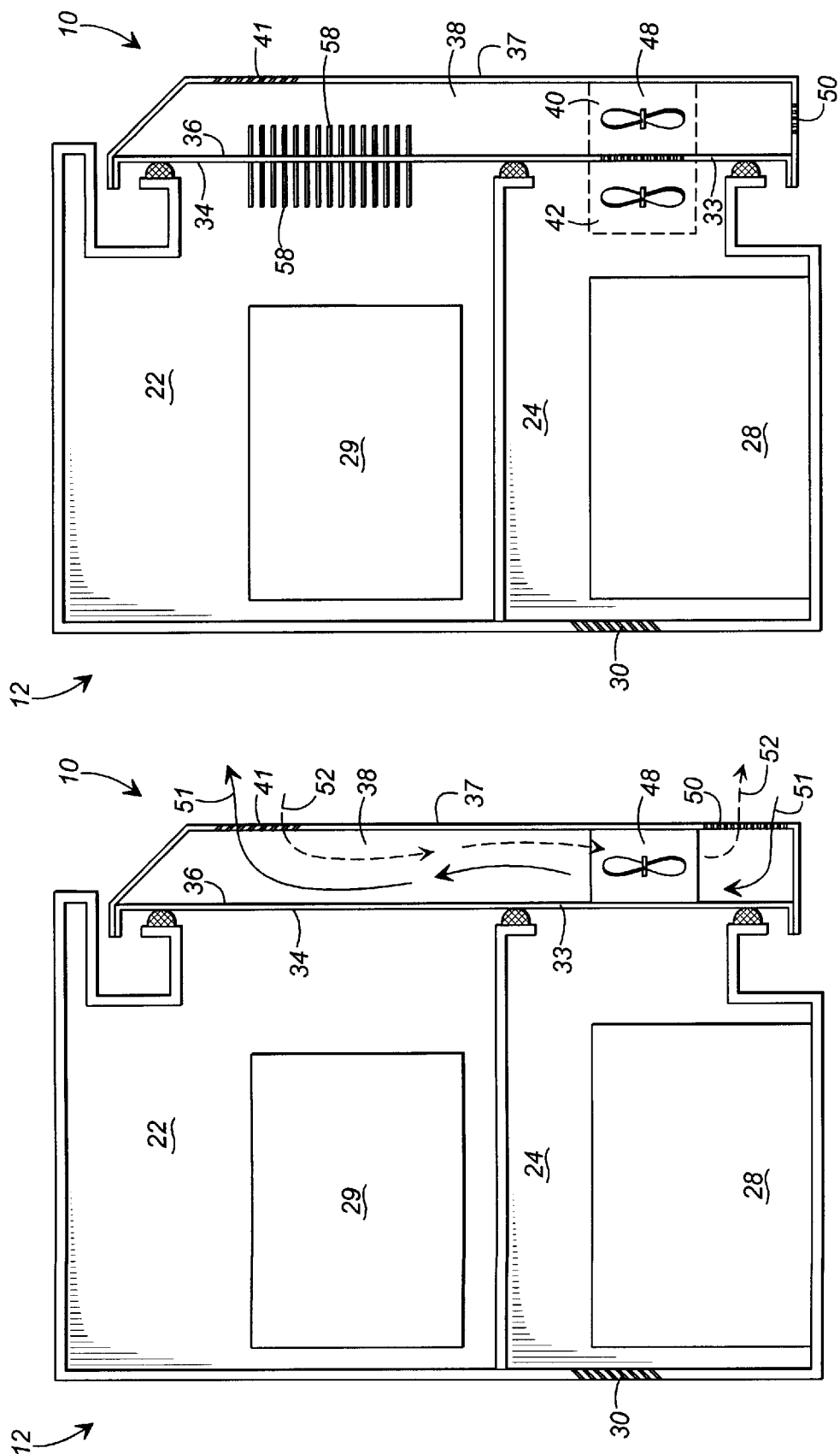

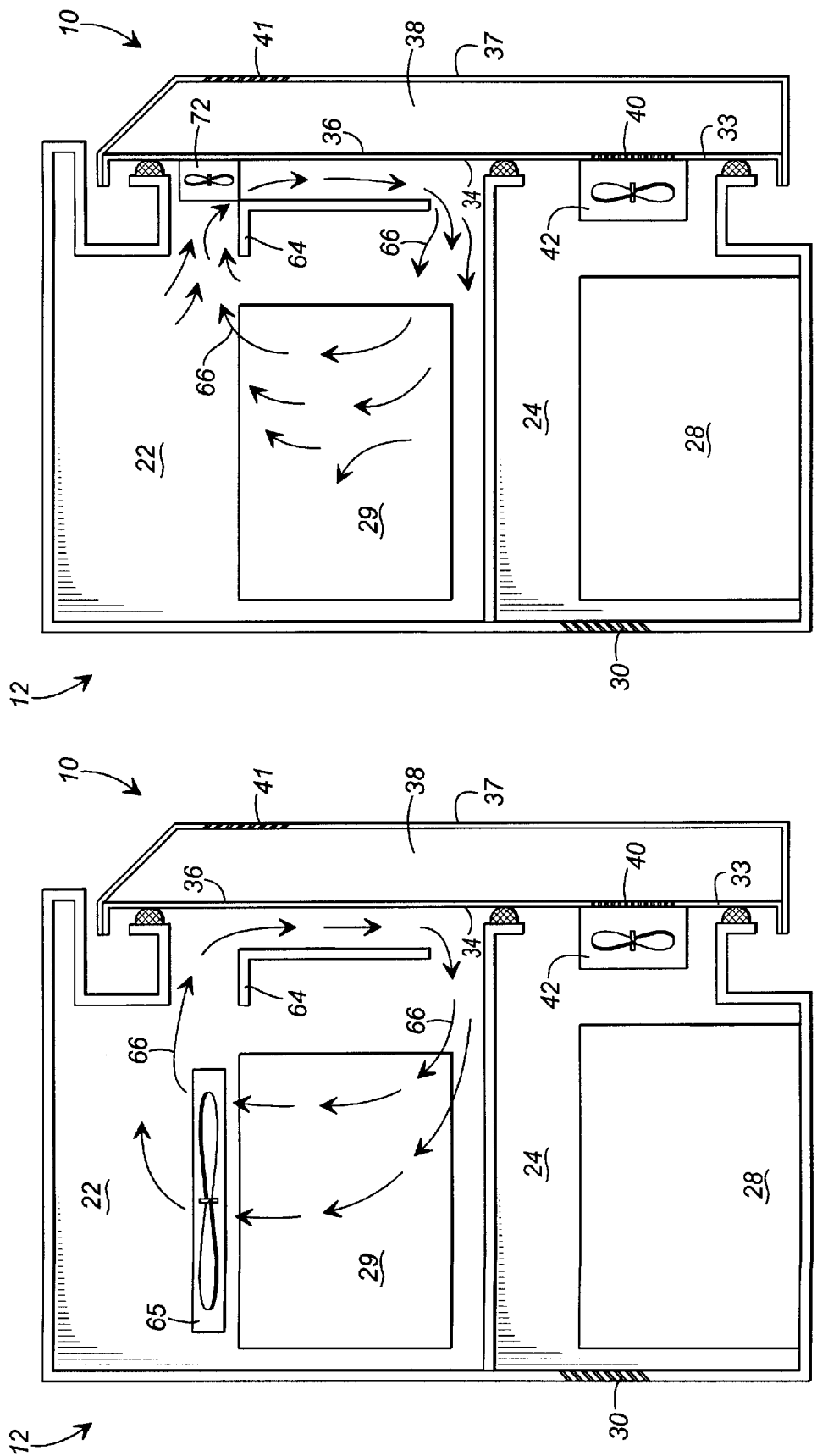

DOOR MOUNTED HEAT EXCHANGER FOR OUTDOOR EQUIPMENT ENCLOSURE

FIELD OF THE INVENTION

The invention relates in general to outdoor equipment enclosures of the type used to house electronics and telecommunications equipment. More particularly, the invention relates to a heat exchanger adapted for use as the door of an outdoor equipment enclosure, the enclosure having at least one sealed interior equipment compartment in which heat-generating electrical equipment is housed, for the purposes of cooling the air within the interior compartment of the enclosure.

BACKGROUND OF THE INVENTION

The use and construction of outdoor equipment enclosures for housing electronics and telecommunications equipment, for example telephone equipment and optical fiber systems, in outdoor environments is well known. These enclosures are typically constructed to have at least one sealed weatherproof compartment in which the equipment is housed. The enclosure will be provided with an opening for access into the equipment compartment or compartments thereof, and a door for being opened and closed on the opening. The door will typically be adapted to be sealed on at least one interior compartment of the enclosure. As the use of telecommunications systems and optical fiber systems has proliferated, greater and greater numbers of outdoor equipment enclosures of this type are now found in a great many locations, to include industrial parks, commercial installations, as well as in residential areas.

Over the course of the past several years, as a result of improvements in the design and construction of electronics, telecommunications, and optical fiber equipment and systems, the power densities of this equipment and these systems have been steadily rising. As a result, therefore, natural convection on the exterior of the outdoor equipment enclosure, which has long been the norm for cooling the interior compartment(s) of the enclosure, can no longer sufficiently cool these newer generations of equipment and systems. As known to those skilled in the art, as the temperature of the equipment increases, the performance of the equipment, and the system of which the equipment is a part, will degrade. As a result, therefore, manufacturers of these outdoor equipment enclosures, as well as telecommunications systems manufacturers and providers, have been seeking ways to cool the equipment housed within these enclosures. Additionally, at least one battery is oftentimes provided for use with the equipment housed within these enclosures. In similar fashion, and as also known in the art, sustained increases in the temperature of the battery within the enclosure tends to decrease the service life of the battery, necessitating costly servicing and/or replacement of the battery.

Examples of solutions to the problem of cooling the equipment housed within an outdoor equipment enclosure of the type discussed are disclosed in several U.S. patents. Common among these patents, however, is the construction of a heat exchanger/heat exchange system directly within the enclosure, also referred to as an equipment cabinet, for the purpose of drawing and/or passing ambient air from outside the equipment enclosure through the enclosure for the purpose of cooling the equipment housed therein. These types of structures are disclosed in U.S. Pat. No. 4,949,218 to Blanchard, et al.; U.S. Pat. No. 5,570,740 to Flores, et al.; U.S. Pat. No. 5,603,376 to Hendrix; U.S. Pat. No. 5,765,743 to Sakiura et al.; and U.S. Pat. No. 5,832,988 to Mistry, et al.

Although the heat exchangers of the aforementioned patents have been designed to cool the air within an outdoor equipment enclosure, they do so with structures that are relatively complicated in construction, and which oftentimes increase the size, and necessarily the expense, of the enclosure in order to house not only the telecommunications or electronics equipment, but also the heat exchange system. Moreover, the complexity of these heat exchange systems, and the difficulties in sealing these heat exchange passages as they pass through the interior compartments of the equipment enclosure lead to potential problems in leakage of the ambient air being passed through the heat exchanger into the sealed interior compartment, or compartments, of the enclosure, thus allowing dust and other airborne debris to be deposited on the equipment, which may cause equipment shorts, and/or may cause the equipment to overheat due to the build up of this debris over time.

In an effort to provide a simpler solution to the problem of cooling outdoor equipment enclosures, door mounted heat exchangers have been developed. Examples of door mounted heat exchangers are found in U.S. Pat. No. 4,535,386 to Frey, Jr., et al; and in U.S. Pat. No. 5,467,250 to Howard, et al. In the '386 patent to Frey, Jr., et al., the outdoor equipment enclosure is constructed such that an "inner chimney" is formed which separates the enclosure into forward and rearward compartments. This allows for the circulation of air through the chimney and about the compartments. The enclosure is provided with a door which seals the access opening of the enclosure, this door being provided with several sealed air passages which will permit ambient air to flow therethrough in the hope that the door will act as a heat exchanger for cooling the air within the enclosure when the air within the sealed part of the enclosure comes into contact with the door. Although Frey, Jr., et al. disclose a simple solution to the cooling of outdoor equipment enclosures, it is not well adapted for the newer generations of telecommunications and electronics equipment housed within these enclosures because of the aforementioned problems of increased power densities. Frey, Jr., et al. disclose a strictly passive heat exchange system which provide no means for positively cooling the enclosure such that heat build up within the enclosure is prevented. Another drawback of the device of Frey, Jr., et al. is that as a passive system, if the air passages within the door of the enclosure become plugged with debris, as is likely to occur over time, the heat exchange construction of the door is mitigated.

In the patent to Howard, et al. an electrical cabinet is disclosed in which a heat exchanger is housed within the door, or doors, of an equipment cabinet, but the door itself does not function as a heat exchanger. The electrical cabinet of Howard, et al. utilizes a fan shelf/compartment constructed within and as a part of the cabinet for holding two spaced series of fans, the fans being in communication with two separate ducts, or series of vents, within the door for drawing ambient air through a first series of these vents, and for passing air from the inside of the cabinet through the second series of vents so that the ambient air will cool the air circulated Within the interior of the cabinet as it is passed through the second series of vents. Although the construction of the electrical cabinet/door mounted heat exchanger of Howard, et al. avoids some of the complexities of the constructions of the heat exchange systems in the patents discussed above, it is still a rather complicated construction which requires at least one separate fan compartment within the cabinet, plus two sets of heat exchange ducts, all of which need to be sealed within and on the cabinet in order to prevent leakage of outside air into the sealed compartments of the enclosure. Moreover, as the construction of the device of Howard, et al. is relatively complex, it will likely require increased maintenance over time, and will also cause the construction of the electrical cabinet, or cabinets with which the system is used to be more expensive.

What is needed, but seemingly unavailable in the art, is a simple door mounted heat exchanger for use with outdoor equipment enclosures which will allow the inner equipment and/or battery compartments of the enclosure to be cooled without an intrusive heat exchange system constructed as a part of and housed within the enclosure, and which can accomplish this need in simple fashion without the unduly complicated constructions of the known devices. What is also needed is a means of cooling not only the equipment within the enclosure, but a means for cooling the batteries housed within these enclosures as well. Moreover, there is a need for a heat exchange system for use with outdoor equipment enclosures which can easily be fit or retrofit to existing constructions of equipment enclosures in an expedient, cost-effective fashion in order to allow for the effective cooling of the electronics/telecommunications equipment housed within these enclosures.

SUMMARY OF THE INVENTION

The present invention provides an improved door mounted heat exchanger adapted for use with outdoor equipment enclosures which overcomes some of the design deficiencies of the known art. The heat exchanger of this invention provides a simple and efficient apparatus which is modular in construction, and which allows for a greater degree of flexibility in the cooling of outdoor equipment enclosures. Moreover, the relative simplicity of the heat exchanger of this invention, when contrasted with the known heat exchange systems, provides a greater degree of reliability, durability, maintainability, and ease of use in addressing the problems of efficiently and costeffectively cooling not only the interior equipment compartment(s) of these enclosures, but of also cooling the battery compartments of these types of enclosures as well.

This invention attains this degree of flexibility, as well as simplicity in design and construction, by providing a modular door mounted heat exchanger for us with outdoor equipment enclosures of the type used to house heat generating electronics and telecommunications equipment, the enclosure being provided with an access opening for allowing access to the interior compartment or compartments within which the equipment is housed. The heat exchanger is fashioned for use as the door of the enclosure, and is mounted on the enclosure so that it opens and closes on the access opening of the enclosure, and seals the access opening of the enclosure as well. The heat exchanger thus includes a door panel sized and shaped to be received on, and to close the access opening of the enclosure. The door panel has an interior surface for facing inwardly of the enclosure, and an exterior surface for facing outwardly of the enclosure. A heat exchanger cover is constructed and arranged to be mounted to the exterior surface of the door panel, the heat exchanger cover defining a plenum therebetween. A first opening into the plenum is defined, and a spaced second opening is defined within the plenum for defining an air flow passage through the plenum. At least one fan operably coupled to the door panel is provided for drawing air into, and exhausting air out of the plenum through the at least first and second openings, respectively. Outside air will be drawn through the plenum by the at least one fan for cooling the exterior surface of the door panel so that the air within the enclosure that comes into contact with the interior surface of the door panel will itself be cooled.

In a first embodiment of the invention, intended for use with outdoor equipment enclosures of the type having an upper sealed equipment compartment and a lower vented battery storage compartment, the at least one fan will draw ambient/outside air through the vented battery compartment to cool the battery compartment, and will also pass this air through the plenum of the heat exchanger and over the exterior of the door panel for allowing the air within the sealed equipment compartment that comes into contact with the interior surface of the door panel to be cooled. The ambient air can be drawn first through the lower battery compartment and then passed through the plenum, or it can be drawn first through the plenum and then passed through the battery compartment of the enclosure.

In a second embodiment of the invention the heat exchanger fan is provided as a radial-type fan mounted within the plenum of the heat exchanger for improved the modularity of the heat exchanger and its ease of use with existing outdoor equipment enclosures.

In a third embodiment of the invention, both of the at least first and second openings, respectively, into the plenum are defined in the heat exchanger cover so that ambient air is drawn through the plenum, only, for cooling the door panel, and more particularly to cool the interior surface thereof, and in turn for allowing the air within the sealed equipment enclosure to be cooled thereby.

In a fourth embodiment of the invention a series of fins are provided on the door panel, the fins projecting inwardly of the sealed equipment enclosure and into the plenum of the heat exchanger for the purposes of increasing the heat exchange surface area and thus the heat exchange performance of the device.

In a fifth embodiment of the invention an elongate duct is provided as a part of the heat exchanger, and is affixed to or formed as a part of the interior surface of the door panel juxtapositioned with the sealed equipment compartment. Any existing electrical compartment fan(s) within the sealed equipment compartment may then be used to pass the air of the sealed interior equipment compartment through the duct, the duct channeling the air within this compartment into engagement with the interior surface of the door panel for improving the heat exchange characteristics thereof. In a sixth embodiment of the invention, a fan is provided as a part of the heat exchanger within the equipment compartment, which fan is mounted to the interior of the door panel for directing the air within the equipment compartment toward and into the above-described duct disposed within the equipment compartment for providing still greater efficiency in the cooling of the air within the sealed equipment compartment of the enclosure.

In a seventh embodiment of the invention, the door panel is formed in convolute fashion for the purposes of increasing the effective surface/heat exchange area within both the equipment compartment of the enclosure and the plenum of the heat exchanger.

It is, therefore, an object of the present invention to provide a door mounted heat exchanger for use with outdoor equipment enclosures of the type used to house heat generating electronics and telecommunications equipment having at least one interior sealed compartment.

It is another object of the present invention to provide a door mounted heat exchanger for use with an outdoor equipment enclosure of the type having at least one vented battery compartment.

It is yet another object of the present invention to provide a door mounted heat exchanger for use with an outdoor equipment enclosure which is simple in design and construction, is rugged and durable in use, and which is easy to use and maintain.

It is to these objects, as well as the other objects, features, and advantages of the present invention, which will become apparent upon reading the specification, when taken in conjunction with the accompanying drawings, to which the invention is directed.

BRIEF DESCRIPTION OF THE DRAWINGS

FIG. 2 is a side elevational view in cross-section of a first embodiment of the door mounted heat exchanger of this invention.

FIG. 3 is a side elevational view in cross-section of a second embodiment of the door mounted heat exchanger of this invention.

FIG. 4 is a side elevational view in cross-section of a third embodiment of the door mounted heat exchanger of this invention.

FIG. 5 is a side elevational view in cross-section of a fourth embodiment of the door mounted heat exchanger of this invention.

FIG. 6 is a side elevational view in cross-section of a fifth embodiment of the door mounted heat exchanger of this invention.

FIG. 7 is a side elevational view in cross-section of a sixth embodiment of the door mounted heat exchanger of this invention.

DETAILED DESCRIPTION OF THE PREFERRED EMBODIMENTS

Figure 1:
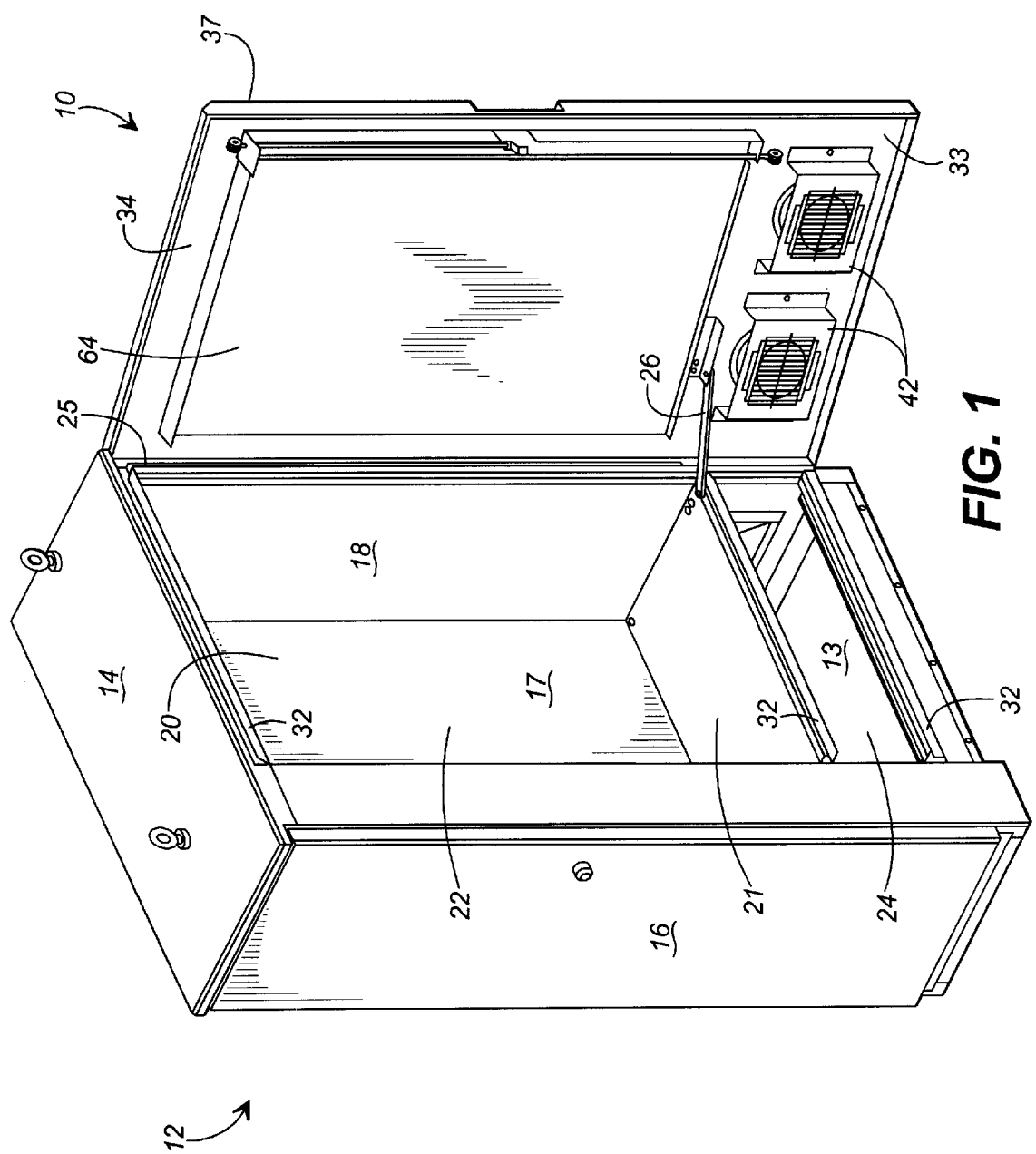
FIG. 1 is a perspective illustration of an outdoor equipment enclosure having the modular door mounted heat exchanger of this invention provided as a part thereof.

Referring now in detail to the drawings, in which like reference characters indicate like parts throughout the several views, a modular door mounted heat exchanger 10 for use with an outdoor equipment enclosure 12 is illustrated. Outdoor equipment enclosure 12, as illustrated, is an exemplary construction of an outdoor equipment enclosure, it being intended that modular door mounted heat exchanger 10 may be used with any of the several types of constructions of outdoor equipment enclosures, or cabinets, to include enclosures having a single door, as well as a plurality of doors, the door mounted heat exchanger comprising either one, or any one of the doors used with these enclosures.

Referring now to FIGS. 1 and 2, the construction of outdoor equipment enclosure 12 is described. The equipment enclosure is provided with a bottom panel 13 and a spaced parallel top panel 14. Extending between the bottom and top panels, respectively, is a first side wall panel 16, a second side wall panel 17, and a third side wall panel 18, the side wall panels being fastened to one another, as well as to the top and bottom panels, along their common edges for forming a sealed type of construction, and which together define an access opening 20 into the interior of the enclosure. An elongate planar shelf 21 is provided for dividing the interior of the equipment enclosure into an upper compartment 22, and a lower compartment 24.

The heat exchanger 10 is shown in FIG. 1 as being affixed to the equipment enclosure 12 by an elongate piano hinge 25. However, It is understood by those skilled in the art that the hinge 25 is exemplary only, and that any type of suitable hinge or other construction used for fastening a door to an outdoor equipment enclosure may be used here. For example, the door panel may be constructed to lift off of the enclosure, or the heat exchanger could be constructed to include a 4-bar linkage or other known type of mechanism adapted for allowing the heat exchanger to be opened and closed on the access opening of the enclosure. Also shown in FIG. 1, is a door bracket or arm 26 used for holding the heat exchanger in an open position on the access opening of the enclosure when access is needed into the interior compartments of the enclosure.

Referring to FIG. 2, a battery 28, or batteries, is schematically illustrated being positioned within the lower compartment 24 of the enclosure. In similar fashion, heat generating electronic equipment 29 is schematically shown in upper compartment 22, the electronic equipment 29, for example, but not by way of limitation, being any type of telecommunications, electronic, or optical fiber equipment of the type commonly housed, or intended to be housed, within an outdoor equipment enclosure. It is anticipated that the upper compartment 22 will be fully sealed once the heat exchanger 10 is closed on access opening 20, as shown in FIG. 2.

A vent or opening 30 is defined within the lower compartment 24 for allowing ambient air to enter into the compartment for cooling the battery, or batteries, 28 housed therein. An elastomeric gasket, or gaskets, 32 are provided, as shown in FIGS. 1 and 2, to ensure that the heat exchanger of this invention is fully received on, and seals at least the upper compartment 22 of the enclosure, and to also seal lower compartment 24 in those instances where the vent or opening 30 is not provided within the lower compartment.

The heat exchanger 10 is comprised of an elongate planar door panel 33 having an interior surface 34 for facing inwardly of the upper and lower compartments, respectively, of the enclosure, and an exterior surface 36 facing outwardly thereof. A heat exchanger cover 37 is removably affixed to door panel 33. Although not illustrated in greater detail, it is anticipated that the heat exchanger cover could be snap fit or press fit onto the door panel, or that a series of threaded fasteners (not illustrated) of the type commonly used to restrict access into telecommunications racks, cabinets, or enclosures could be passed through the heat exchanger cover and the door panel, and a threaded nut (not illustrated) passed over the fastener on the inside of the door panel such that the heat exchanger cover cannot be removed without first opening the door mounted heat exchanger on equipment enclosure 12. Also, it is anticipated that the heat exchanger 10 will be provided with a suitable conventional locking device such that the heat exchanger cannot be opened on the equipment enclosure by other than those with a need and the authority to enter the enclosure.

Heat exchanger cover 37, in cooperation with exterior surface 36 of the door panel, forms a plenum 38 through which air may be passed. This is accomplished by providing a first opening 40 defined in the door panel 33, and a spaced second opening 41 defined in the heat exchanger cover. At least one fan 42 is provided, two being shown in FIG. 1, which is mounted on the interior surface 34 of door panel 33. So constructed, fan 42 may be used to selectively draw air through vent opening 30 and the lower battery compartment 24 first, force the air through opening 40 defined in the door of the heat exchanger, and then pass the air through the plenum 38 for cooling the exterior surface 36 of door panel 33 such that the air within upper compartment 22 that comes into contact with the interior surface 34 of the door panel is cooled, and from there exhaust the outside air through the opening 41 defined in the heat exchanger cover, along a first air flow path 44.

This air flow path may be selectively reversed based on the needs and desires of the end user, as shown in broken line by reference character 45, such that ambient air is first drawn through the opening 41 defined in the plenum of the heat exchanger, passed along the exterior surface of the door panel, and then forced through the lower or battery compartment 24 of the enclosure for maximizing the cooling effect on door panel 33, and in particular on interior surface 34 thereof, prior to passing the air through the battery compartment 24. Although reference is made to a battery or batteries 28 being positioned within the lower compartment 24, it is anticipated that lower compartment 24 could be functioning merely as a pedestal in the event that a battery is not provided as a part of the outdoor equipment enclosure, it not being intended that batteries need to be provided as a part of the enclosure in order for this invention to be used with outdoor equipment enclosures.

A second embodiment of the heat exchanger 10 is illustrated in FIG. 3, which, in most all aspects, is similar to the construction of the heat exchanger 10 of FIG. 2, with the single exception that rather than providing fan 42 mounted to the interior surface 34 of door panel 33, the fan is provided as a radial-type fan 48 which is mounted within the plenum 38 of the heat exchanger 10. This construction may prove beneficial where the space within lower compartment 24 is limited, and/or it is not desirable to have a fan projecting inwardly of the lower compartment of the enclosure. In all other aspects, however, the operation of the second embodiment of heat exchanger 10 shown in FIG. 3 will be the same as that of the embodiment in FIG. 2, namely air will be drawn either through the lower compartment 24 and passed through the plenum 38, or may be first drawn through the plenum 38, and then passed through the lower compartment 24.

A third embodiment of the door mounted heat exchanger 10 of this invention is illustrated in FIG. 4, in which, once again, a radial-type fan 48 is used, but rather than providing an opening 40 within the door panel in communication with the lower compartment 24 of the enclosure 12, an opening 50 is defined in the heat exchanger cover 37 such that air is drawn through and passed within the plenum 38 of the heat exchanger cover 37 only, and does not otherwise pass through any one, or both, of the compartments of the enclosure. In this construction, therefore, as air is drawn through the plenum 38, it will cool the exterior surface 36 of door panel 33, the interior surface 34 of the door panel being used to cool both the upper compartment 22 and lower compartment 24 of the enclosure by convection, without any kind of forced air movement or passage through any one or both of the enclosure compartments.

Referring now to FIG. 5, a fourth embodiment of the door mounted heat exchanger 10 of this invention is illustrated which is similar in most all aspects to the construction of the door mounted heat exchanger shown in FIGS. 2 through 4, with the exception that a series of spaced fins 58 is provided for improving the heat exchange surface area and thus the cooling efficiency of the heat exchanger. In this construction a spaced series of fins 58 is affixed to or formed as a part of the interior surface 34 of door panel 33, which fins project inwardly of the upper equipment compartment 22. The fins 58 are also formed as a part of, or mounted on the exterior surface 36 of the door panel and project into the plenum 38. Although not shown, it is anticipated that the fins 58 may also be provided as a part of the door panel extending along the lower compartment 24, if so desired, and project inwardly thereof as well. The fins 58 may be horizontally disposed, as shown, or may be vertically disposed fins running at least partially along the length of the door panel 33, as desired, and based upon the air flow characteristics of the fan, or fans, used as a part of the heat exchanger and the construction of the enclosure, as well as the space available within the compartment(s) of the enclosure into which the fins will project.

A fifth embodiment of heat exchanger 10 is illustrated in FIG. 6, which is similar in construction to that embodiment of the heat exchanger shown in FIG. 2, with the exception that an elongate duct 64 is provided as a part of the heat exchanger, and may either be affixed to the interior surface 34 of the door panel 33, for example in metallic constructions, or could be formed as a part of the door panel as a part of a plastic or fiberglass extrusion, for example. Duct 64 will be sized and shaped such that it will channel the air within the upper equipment enclosure 22 into engagement with, and pass it at least partially along the interior surface 34 of the door panel for improving the heat exchange performance of the heat exchanger. This is accomplished in the embodiment of FIG. 6 through the use of a fan 65 otherwise provided as a part of the upper equipment compartment, in conventional fashion, and which is used to circulate the air within the upper sealed equipment compartment 22, about equipment 29. The fan 65 will direct the air within the compartment along an air flow path 66 and through the channel formed by the duct 64.

Although the construction of the remainder of the heat exchanger 10 in FIG. 6 resembles the construction of the heat exchanger shown in FIG. 2, due to the simplicity of the construction of the heat exchanger in its several embodiments the possibility exists that the heat exchanger of FIG. 6 could include some, or all, of the other illustrated features of this invention. What is intended here is that the heat exchanger be modular in its construction. For example, and not by way of limitation, it is intended that the end user will have the ability to interchange the door panel of FIGS. 1 through 4 with that of FIGS. 5, 6 and 7, or 8 as desired, or position the fans 42, 48, and 79 as shown in one of several mounting positions, or provide an interior duct 64, with or without the fan 72, and with or without fins or a convolute section 76, as described below, which could project into the channel formed by duct 64, so that the finished heat exchanger may selectively utilize some or perhaps all of the features of the other illustrated embodiments of the heat exchanger. What is intended is that the end user will have the ability to select from the several illustrated features of the invention when specifying and/or constructing the heat exchanger for their particular usage.

A sixth embodiment of the door mounted heat exchanger 10 is illustrated in FIG. 7, which again is similar in most all aspects to that of FIG. 6, with the exception that a fan 72 is mounted on the interior surface 34 of door panel 33 within the upper equipment compartment, and provided as a part of the heat exchanger, rather than as a part of the upper equipment compartment 22 of the enclosure. The fan 72 will be powered as described below, and will draw the air within the equipment compartment along the air flow path 66 and through the channel formed by duct 64 for still improved efficiency in cooling the upper equipment compartment 22 of equipment enclosure 12. Again, the construction of the remainder of the door mounted heat exchanger 10 shown in FIG. 7 could just as easily mirror that shown in FIGS. 1 through 6 and 8, when, and as desired, the embodiments of the invention shown in FIGS. 1 through 8 being illustrative, and not restrictive of the differing combinations thereof that can be used in any one single application.

Figure 8:
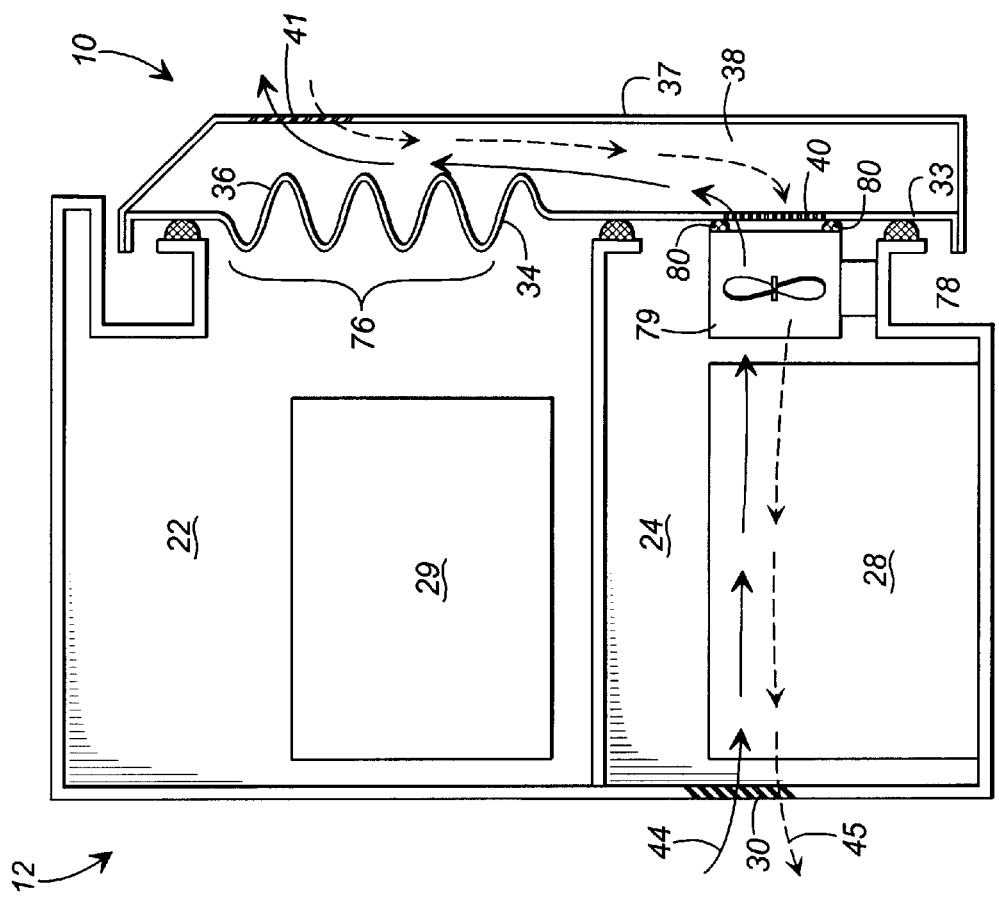
FIG. 8 is a side elevational view in cross-section of a seventh embodiment of the door mounted heat exchanger of this invention.

FIG. 8 illustrates a seventh embodiment of the heat exchanger 10. The heat exchanger 10 once again includes a door panel 33 and a heat exchanger cover 37 forming a plenum 38 in cooperation with the door panel, but here the door panel 33 is shaped to include a convolute section 76, which convolute section is provided for the same reason that are the fins 58 above, namely for the purpose of increasing the effective surface area of the door panel in engagement with the air in both the equipment compartment 22 as well as in the plenum 38, and to increase the heat exchanger's performance accordingly. Moreover, and as with the fins 58 of FIG. 5, the convolute section 76 may extend horizontally as shown, or may be formed to extend vertically in the lengthwise direction of the door panel 33, and could also extend along the portion of the door panel extending over the lower compartment 24 of the enclosure.

FIG. 8 also illustrates a third possibility in mounting the fan used as a part of the device. Here a fan 79, similar in design and construction to the fans 42, 65, and/or 72 described above, is mounted within the lower compartment 24 of the enclosure 12 rather than being mounted to, or in, the door panel 33 or the plenum 38, respectively. A fan mount bracket 78 is affixed to the enclosure, to which the fan 79 is in turn mounted. The fan 79 is operably coupled to the door panel of the heat exchanger by a flexible shroud or gasket 80 which extends about the periphery of the fan, and which seals the fan to the opening 40 defined in the door panel. Otherwise, and as this is a modular construction, the remainder of the embodiment of the heat exchanger 10 shown in FIG. 8 may take the form of any one, or combination, of the constructions shown in FIGS. 1 through 8. Since the door panel 33 will be affixed to the enclosure 12 by hinge 28 or any other door opening type of mechanism of suitable construction, the door panel, and in turn the remainder of the heat exchanger, may be quickly and easily added or removed to any of the several types of outdoor equipment enclosures now in use, in modular fashion.

It is anticipated that there will be at least one fan, and as many fans as desired, or necessary, to attain any desired air flow characteristics through the plenum 38, the upper compartment 22, the lower compartment 24, or the duct 64, for the purposes of cooling equipment enclosure 12, and more particularly upper compartment 22 thereof. Moreover, although certain embodiments of the invention illustrate a door mounted fan 42 affixed to the interior surface of door panel 33, or the radial-type fan 48 mounted within the plenum 38 of the heat exchanger, or the fan 79 mounted within the lower compartment of the enclosure, it is anticipated that the fan or fans used with the heat exchanger may be interchangeably mounted within any one of these positions, based on the desired construction and the needs of the end-user.

The fans 42, 48, 65, 72, and 79, respectively, shown in FIGS. 1 through 8 are conventional fans of the type intended for use in cooling electronic equipment, and are capable of being adapted for use in heat exchanger 10. The fan or fans of the heat exchanger may be provided with power through flexible cabling extending from a power source provided within the equipment enclosure 12 as a part of its construction, in known fashion. For example, it is anticipated that the fans 42, 48, 65, 72, and 79 could be powered by a rectifier fed from a 48-volt buss, or from batteries to a 48-volt buss, through flexible cabling to the fan, or fans used with the heat exchanger. Also, although not illustrated in greater detail, it is also possible that the fans could be battery powered, or solar powered in remote locations where adequate power sources within the equipment enclosure 12 are not otherwise provided or available.

Both the heat exchanger 10 and the equipment enclosure 12 in all the embodiments of this invention are conventionally constructed of a light gauge metal or other rigid, durable, weather-resistant material used for forming outdoor equipment enclosures, which may include plastics and/or fiberglass constructions which are adapted for housing electronics and telecommunications equipment in outdoor environments. Also, the vent opening 30 within the lower equipment compartment 24, as well as the openings 40, 41, and 50 defined within the heat exchanger 10 may be provided with a suitable mesh or filter screen of a desired type and size based on the ambient air conditions at the location of equipment enclosure 12, and the usage of door mounted heat exchanger 10 therewith for preventing the passage of airborne objects and/or debris therethrough.

Although several preferred embodiments of the invention have been disclosed in the foregoing specification, it is understood by those skilled in the art that many modifications and other embodiments of the invention will come to mind to which the invention pertains, having the benefit of the teaching presented in the foregoing description and the associated drawings. It is thus understood that the invention is not limited to the specific embodiments disclosed herein, and that many modifications and other embodiments of the invention are intended to be included within the scope of the appended claims. Moreover, although specific terms are employed herein, as well as in the claims, they are used in the generic and descriptive sense only, and not for the purposes of limiting the described invention, nor the claims which follow.

I claim:

1. A modular door mounted heat exchanger for use with an outdoor equipment enclosure of the type used to house electronics and telecommunications equipment, the enclosure being provided with an access opening for allowing access to the equipment housed therein, said heat exchanger comprising:

a door panel sized and shaped to be received on and to close the access opening of the enclosure, said door panel having an interior surface for facing inwardly of the enclosure, and an exterior surface for facing outwardly of the enclosure;

a heat exchanger cover constructed and arranged to be mounted to the exterior surface of said door panel, said heat exchanger cover defining a plenum between the exterior surface of the door panel and the heat exchanger cover;

at least a first opening into said plenum and at least a spaced second opening into said plenum for defining an air flow path within and at least partially along said plenum; and at least one fan operably coupled to said door panel and being constructed and arranged to draw air into and exhaust air out of said plenum through said at least first and second openings, respectively;

whereby outside air drawn through the plenum by the at least one door mounted fan cools the exterior surface of the door panel so that the air within the enclosure that comes into contact with the interior surface of the door panel is cooled.

2. The heat exchanger of claim 1, wherein said heat exchanger cover is constructed and arranged to be removably fastened to said door panel.

3. The heat exchanger of claim 1, wherein said at least one fan is mounted on the interior surface of said door panel.

4. The heat exchanger of claim 1, wherein said at least one fan is mounted within the equipment enclosure.

5. The heat exchanger of claim 1, wherein said at least one fan is mounted within the plenum of said heat exchanger.

6. The heat exchanger of claim 1, wherein said at least a first opening is defined in said door panel and said at least a second opening is defined in said heat exchanger cover.

7. The heat exchanger of claim 1, wherein each of said at least a first and second openings, respectively, is defined in said heat exchanger cover.

8. The heat exchanger of claim 1, further comprising a spaced series of fins on said door panel, each said fin projecting away from the interior surface of the door panel and also projecting away from the exterior surface of the door panel and into the plenum of the heat exchanger.

9. The heat exchanger of claim 1, said door panel being sized and shaped as a convolute door panel.

10. The heat exchanger of claim 1, further comprising an elongate duct along the interior surface of the door panel, said duct being sized and shaped to channel air within the enclosure into engagement with the interior surface of the door panel.

11. The heat exchanger of claim 10, further comprising at least a second fan for directing air within the enclosure into said duct.

12. The heat exchanger of claim 11, said at least a second fan being mounted to said door panel.

13. A modular door mounted heat exchanger for use with an outdoor equipment enclosure, the equipment enclosure including a first electronics compartment for housing heat generating electronics and telecommunications equipment therein and a separate second battery compartment for housing at least one battery therein, the enclosure defining a common access opening for allowing access into both of the electronics and battery compartments of the enclosure, said heat exchanger comprising:

a door panel sized and shaped to be received on and to close the access opening of the enclosure, said door panel having an interior surface facing inwardly of the enclosure, and an exterior surface facing outwardly of the enclosure;

a heat exchanger cover constructed and arranged to be mounted to the exterior surface of said door panel, said heat exchanger cover defining a plenum therebetween in cooperation with said door panel;

at least a first opening defined in said door panel juxtapositioned with the battery compartment of the enclosure, and at least a spaced second opening defined in the heat exchanger cover for defining an air flow path within the plenum between the exterior surface of the door panel and the heat exchanger cover; and at least one fan operably coupled to said door panel and being constructed and arranged to draw outside air through both of the battery compartment and the plenum for cooling the battery compartment of the enclosure, and for cooling the exterior surface of the door panel so that air within the enclosure that comes into contact with the interior surface of the door panel is cooled thereby.

14. The heat exchanger of claim 13, wherein said at least one fan is constructed and arranged to draw outside air into the plenum through the at least a first opening in the door panel and to exhaust the outside air from the plenum through the at least a second opening in the heat exchanger cover.

15. The heat exchanger of claim 13, wherein said at least one fan is constructed and arranged to draw outside air into the plenum through said at least a second opening in the heat exchanger cover and to exhaust the outside air from the plenum through the at least a first opening in the door panel.

16. The heat exchanger of claim 13, wherein said at least one fan is mounted on the interior surface of said door panel.

17. The heat exchanger of claim 13, wherein said at least one fan is mounted within the interior of the equipment enclosure.

18. The heat exchanger of claim 13, wherein said at least one fan is mounted within said plenum.

19. The heat exchanger of claim 13, further comprising a series of spaced fins on said door panel, each said fin projecting away from the interior surface of the door panel and also projecting away from the exterior surface of the door panel and into the plenum of the heat exchanger.

20. The heat exchanger of claim 13, said door panel being sized and shaped as a convolute door panel.

21. The heat exchanger of claim 13, further comprising an elongate duct along the interior surface of the door panel, said duct being sized and shaped to channel air within the electronics compartment of the enclosure into engagement with the interior surface of the door panel.

22. The heat exchanger of claim 21, further comprising at least a second fan for directing air within the electronics compartment of the enclosure into said duct.

23. The heat exchanger of claim 22, said at least a second fan being mounted to said door panel.

24. An outdoor equipment enclosure with a modular door mounted heat exchanger, the enclosure being used to house heat generating electronics and telecommunications equipment and at least one battery, said enclosure comprising:

a base panel and a spaced top panel;

a plurality of wall panels extending from the base panel to the top panel, said wall panels being joined to one another and to the base and top panels, respectively, along their common edges for forming the enclosure, and for defining an access opening into said enclosure;

a first electronics compartment within said enclosure for housing the heat generating electronics and telecommunications equipment therein;

a second separate battery compartment for housing the at least one battery therein; and a modular door mounted heat exchanger for being sealed on and closing the access opening within the enclosure, said heat exchanger comprising:

i) a modular door panel having an interior surface facing inwardly of the enclosure, and an exterior surface facing outwardly of the enclosure;

ii) a heat exchanger cover constructed and arranged to be mounted to the exterior surface of said door panel, said heat exchanger cover defining a plenum therebetween in cooperation with said door panel;

iii) at least a first opening defined in said door panel and in communication with the battery compartment, and at least a spaced second opening defined in the heat exchanger cover for defining an air flow path within the plenum; and iv) at least one fan operably coupled to said door panel and being constructed and arranged to draw outside air through both of the battery compartment and the plenum for cooling the battery compartment of the enclosure, and for cooling the exterior surface of the door panel so that air within the enclosure that comes into contact with the interior surface of the door panel is cooled thereby.

* * * * *